(12) United States Patent
Shin

(10) Patent No.: US 7,157,968 B2
(45) Date of Patent: Jan. 2, 2007

(54) METHOD AND APPARATUS FOR PROTECTING A SWITCHING AMPLIFIER FROM EXCESS CURRENT

(75) Inventor: Jaeyoung Shin, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 92 days.

(21) Appl. No.: 11/030,776

(22) Filed: Jan. 5, 2005

(65) Prior Publication Data

US 2005/0253648 A1    Nov. 17, 2005

(30) Foreign Application Priority Data

May 17, 2004    (KR)    ...... 10-2004-0034826

(51) Int. Cl.
*H03F 3/317*    (2006.01)
*H03F 1/52*    (2006.01)
(52) U.S. Cl. .................... 330/251; 330/298
(58) Field of Classification Search .......... 330/251, 330/207 A, 146
See application file for complete search history.

(56) References Cited

U.S. PATENT DOCUMENTS 5,008,586 A * 4/1991 Miyazaki et al. .......... 323/315
5,973,569 A * 10/1999 Nguyen ..................... 330/298
6,603,353 B1 8/2003 Ishida
6,859,096 B1 * 2/2005 Tanaka et al. ............... 330/10
2001/0010482 A1 8/2001 Oki et al.
2004/0061552 A1 4/2004 Tanaka et al.
2004/0196072 A1 10/2004 Jiandong

FOREIGN PATENT DOCUMENTS

EP    1193867    4/2002

* cited by examiner

*Primary Examiner*—Robert Pascal
*Assistant Examiner*—Alan Wong
(74) *Attorney, Agent, or Firm*—Marger Johnson & McCollom, P.C.

(57) ABSTRACT

A class D switching amplifier has a pulse width modulator that drives a speaker. The amplifier includes an over-current protection circuit, which includes current-monitoring MOSFETs that are each in parallel with one of four power MOSFETs. Signals taken from one side of the current-monitoring MOSFETs go to a logic circuit that removes the amplifier input circuit when the logic circuit indicates that an over-current condition is present. Current through the current-monitoring MOSFETs also goes through the speaker, thus improving amplifier efficiency.

33 Claims, 11 Drawing Sheets

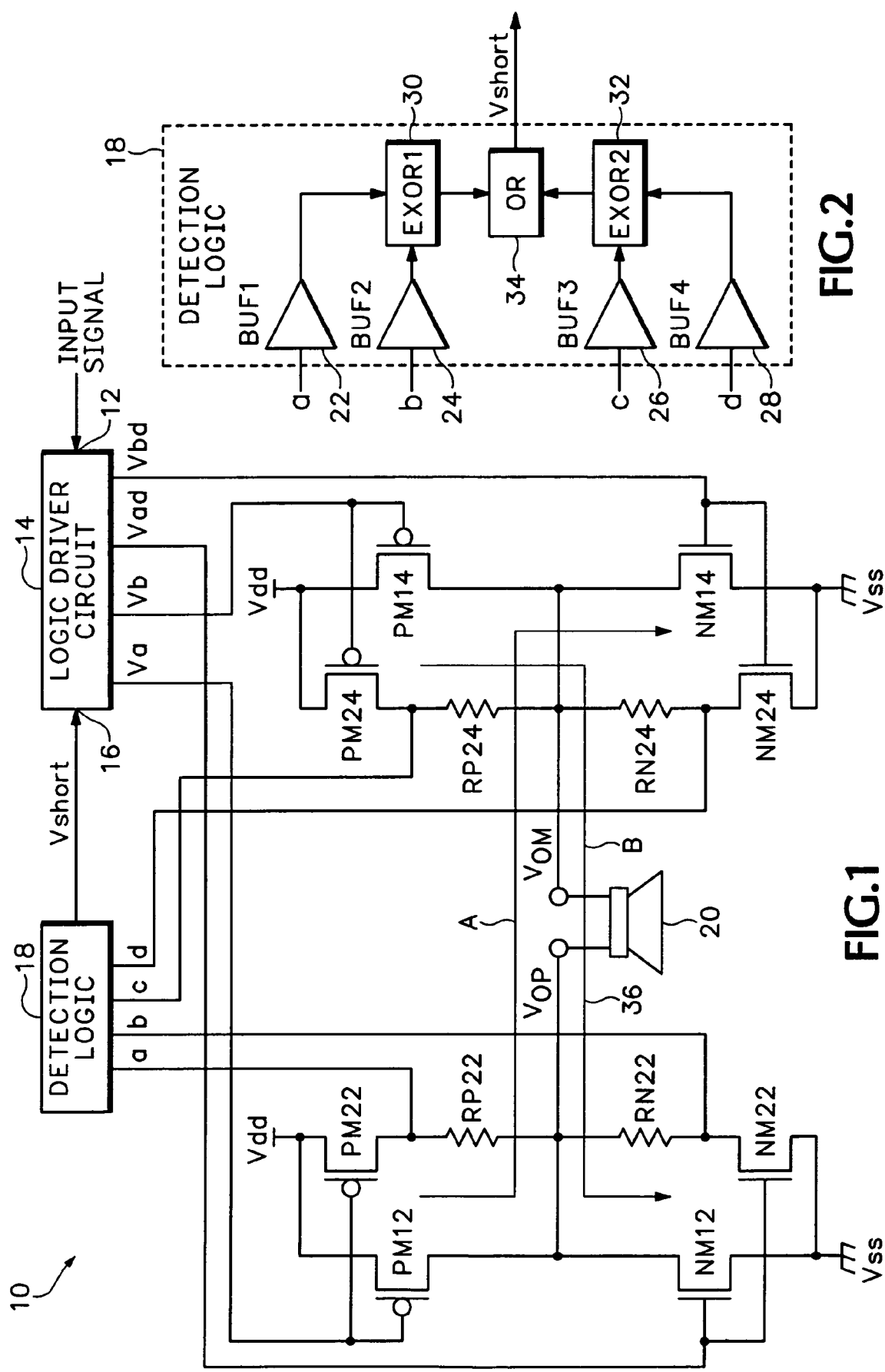

FIG.9

| Va | Vad | Vb | Vbd | A GROUP Vop | a | b | B GROUP Vom | c | d | NOTE |
|---|---|---|---|---|---|---|---|---|---|---|
| 0 | 0 | 0 | 0 | 1 | 1 | 1 | 1 | 1 | 1 | NO CURRENT PATH |
| 0 | 0 | 1 | 1 | 1 | 1 | 1 | 0 | 0 | 0 | CURRENT PATH A |
| 1 | 1 | 0 | 0 | 0 | 0 | 1 | 1 | 1 | 1 | CURRENT PATH B |
| 1 | 1 | 1 | 1 | 0 | 0 | 0 | 0 | 0 | 0 | NO CURRENT PATH |
| 1 | 0 | 1 | 0 | F | F | F | F | F | 1 | NO CURRENT PATH |
| 1 | 0 | 0 | 0 | F | F | F | F | F | 0 | NO CURRENT PATH |
| 1 | 0 | 1 | 1 | F | F | F | 1 | 1 | 0 | NO CURRENT PATH |
| 0 | 0 | 1 | 0 | 1 | 1 | 1 | 0 | 0 | F | NO CURRENT PATH |
| 1 | 1 | 1 | 0 | 0 | 0 | 0 | F | F | F | NO CURRENT PATH |

FIG.10

| Va | Vad | Vb | Vbd | A GROUP Vop | a | b | B GROUP Vom | c | d | NOTE |
|---|---|---|---|---|---|---|---|---|---|---|
| 0 | 0 | 0 | 0 | 1 | 1 | 1 | 1 | 1 | 1 | NO CURRENT PATH |
| 0 | 0 | 1 | 1 | X | 1 | X | X | X | 0 | CURRENT PATH A |
| 1 | 1 | 0 | 0 | X | X | 0 | X | 1 | X | CURRENT PATH B |
| 1 | 1 | 1 | 1 | 0 | 0 | 0 | 0 | 0 | 0 | NO CURRENT PATH |
| 1 | 0 | 1 | 0 | F | F | F | F | F | F | NO CURRENT PATH |
| 1 | 0 | 0 | 0 | 1 | F | F | 1 | F | 1 | NO CURRENT PATH |
| 1 | 0 | 1 | 1 | 0 | 1 | F | 0 | 0 | 0 | NO CURRENT PATH |
| 0 | 0 | 1 | 0 | 1 | 1 | 1 | 1 | F | F | NO CURRENT PATH |
| 1 | 1 | 1 | 0 | 0 | 0 | 0 | 0 | F | F | NO CURRENT PATH |

FIG.11

| Va | Vad | Vb | Vbd | A GROUP | | | B GROUP | | | NOTE |
|---|---|---|---|---|---|---|---|---|---|---|
| | | | | Vop | a | b | Vom | c | d | |
| 0 | 0 | 0 | 0 | 1 | 1 | 1 | 1 | 1 | 1 | NO CURRENT PATH |
| 0 | 0 | 1 | 1 | 1 | 1 | 1 | 0 | 0 | 0 | CURRENT PATH A |
| 1 | 1 | 0 | 0 | 1 | 1 | 0 | 1 | 1 | 1 | CURRENT PATH B |
| 1 | 1 | 1 | 1 | 1 | 1 | 0 | 0 | 0 | 0 | CURRENT PATH B |
| 1 | 0 | 0 | 0 | 1 | 1 | 1 | F | F | F | NO CURRENT PATH |
| 1 | 0 | 0 | 0 | 1 | 1 | 1 | 1 | 1 | 1 | NO CURRENT PATH |
| 1 | 0 | 1 | 1 | 1 | 1 | 1 | 0 | 0 | 0 | CURRENT PATH A |
| 0 | 0 | 0 | 0 | 1 | 1 | 1 | F | F | F | NO CURRENT PATH |
| 1 | 1 | 1 | 0 | 1 | 1 | 0 | F | F | F | CURRENT PATH B |

FIG.12

| Va | Vad | Vb | Vbd | A GROUP | | | B GROUP | | | NOTE |
|---|---|---|---|---|---|---|---|---|---|---|
| | | | | Vop | a | b | Vom | c | d | |
| 0 | 0 | 0 | 0 | 1 | 1 | 1 | 0 | 1 | 0 | CURRENT PATH A |
| 0 | 0 | 1 | 1 | 0 | 1 | 0 | 0 | 0 | 0 | CURRENT PATH B |
| 1 | 1 | 0 | 0 | 0 | 0 | 0 | 0 | 1 | 0 | CURRENT PATH A |
| 1 | 1 | 1 | 1 | 0 | 0 | 0 | 0 | 0 | 0 | NO CURRENT PATH |
| 1 | 0 | 0 | 0 | F | F | F | 0 | 0 | 0 | NO CURRENT PATH |
| 1 | 0 | 0 | 0 | F | F | F | 0 | 1 | 0 | CURRENT PATH A |
| 1 | 0 | 1 | 1 | F | F | F | 0 | 0 | 0 | NO CURRENT PATH |
| 0 | 0 | 0 | 0 | 1 | 1 | 1 | 0 | 0 | 0 | CURRENT PATH B |
| 1 | 1 | 1 | 0 | 0 | 0 | 0 | 0 | 0 | 0 | NO CURRENT PATH |

FIG.13

| Va | Vad | Vb | Vbd | A GROUP | | | B GROUP | | | NOTE |
|----|-----|----|----|---------|---|---|---------|---|---|------|
| | | | | Vop | a | b | Vom | c | d | |
| 0 | 0 | 0 | 1 | 1 | 1 | 1 | X | 1 | 0 | CURRENT PATH B |
| 0 | 1 | 0 | 1 | X | 1 | 0 | X | 1 | 0 | CURRENT PATH A AND B |
| 1 | 0 | 0 | 1 | F | F | F | X | 1 | 0 | CURRENT PATH B |
| 1 | 1 | 0 | 1 | 0 | 0 | 0 | X | 1 | 0 | CURRENT PATH B |
| 0 | 1 | 0 | 0 | X | 1 | 0 | 1 | 1 | 1 | CURRENT PATH A |
| 0 | 1 | 1 | 0 | X | 1 | 0 | F | F | F | CURRENT PATH A |
| 0 | 1 | 1 | 1 | X | 1 | 0 | 0 | 0 | 0 | CURRENT PATH A |

US 7,157,968 B2

METHOD AND APPARATUS FOR PROTECTING A SWITCHING AMPLIFIER FROM EXCESS CURRENT

CROSS REFERENCE TO RELATED APPLICATION

This application claims priority under 35 USC § 119 to Korean Patent Application No. 2004-34826 filed on May 17, 2004, the content of which is incorporated herein by reference in its entirety.

BACKGROUND OF THE INVENTION

1. Field of the Invention

The present invention relates generally to methods and apparatus for protecting a switching amplifier from an over-current condition and more particularly to such methods and apparatus that optimize amplifier efficiency.

2. Description of Related Art

In switching amplifiers, such as a Class D amplifier, the input signal is modulated by a pulse width modulator. This modulated signal is applied to the input of an output stage that comprises power FETs. In one application, the output stage is connected to external speakers and drives them according to the modulated signals. One use for such amplifiers is to drive stereo and television speakers.

Because each power FET has a limited current capacity, it can be damaged if excess current flows therethrough. Such excess current can be caused either by a short or by an unintended input signal that can produce excessive current in the power FETs. As a result, it is necessary to protect these power FETs from excess current.

Such protection has to account for excess current produced in several different ways. First, excessive current may be generated as a result of a short of the amplifier output terminals across which the speaker or other load is connected. Second, the output terminals may be shorted to the ground or to the high side of the power supply. Third, an unintended input signal may be applied to the amplifier input and thereby produce excessive current.

In the past, over-current conditions were monitored by driving a second FET and a resistor with the same signal as a power FET. The voltage on one side of the resistor was monitored to determine whether it rose above a pre-defined level. Whenever it did, an over-current protection circuit was triggered.

While this prior art approach provided some protection from over-current conditions, it did so at the expense of amplifier efficiency because the current in the monitoring FET and resistor did not flow through the load, e.g., a speaker.

The present invention will be more fully apparent when the following detailed description is read in view of the accompanying drawings.

BRIEF DESCRIPTION OF THE DRAWINGS

FIG. 1 is a schematic diagram of a circuit implemented in accordance with the present invention.

FIG. 2 is a more detailed schematic depiction of a portion of the circuit of FIG. 1.

FIGS. 9–13 are tables depicting signal levels of the embodiment of FIG. 1 during conditions depicted in FIGS. 1, 5, 6, 7, and 8, respectively.

DETAILED DESCRIPTION OF THE PREFERRED EMBODIMENTS

Figure 3:
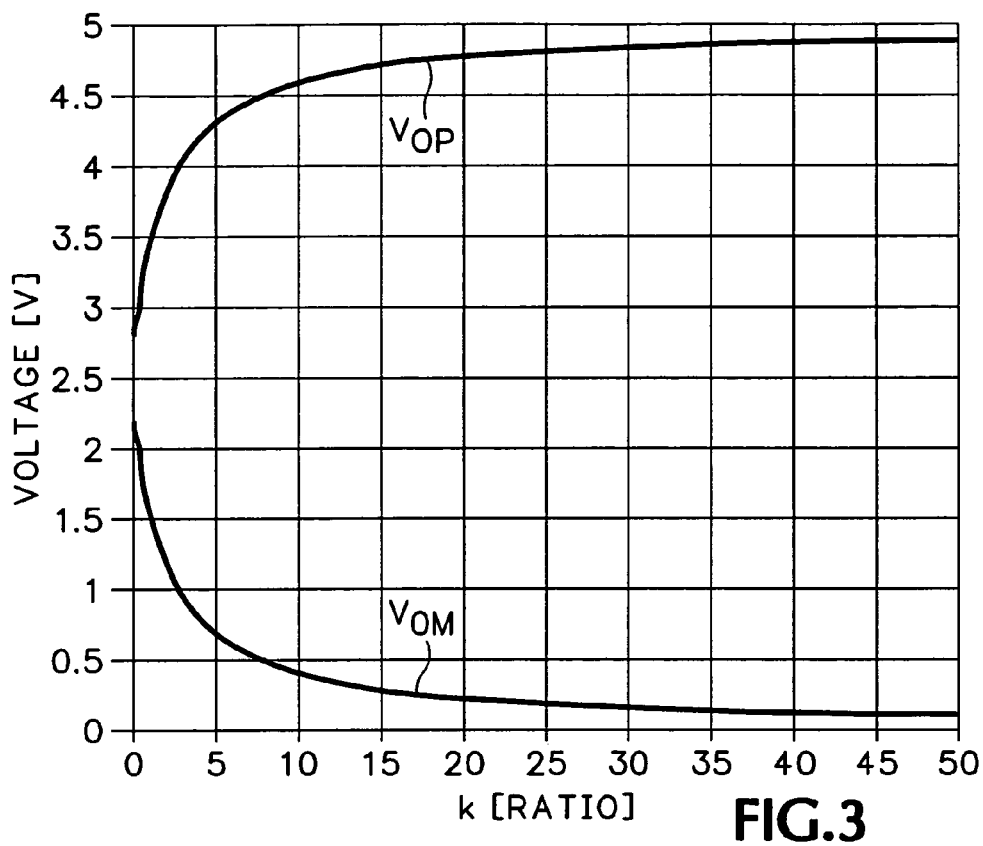
FIGS. 3 and 4 are graphs depicting operational characteristics of the circuit of FIGS. 1 and 2.

Indicated generally at 10 in FIG. 1 is a class D amplifier having an over-current protection circuit constructed in accordance with the present invention. Generally speaking, an input signal is applied to an input terminal 12 of a logic driver circuit 14. The logic driver circuit includes four outputs $V_a$, $V_b$, $V_{ad}$ and $V_{bd}$ as shown. Logic driver circuit 14 includes a pulse-width modulator (PWM) that converts the input signal into high-frequency rectangular waves, the average value of which tracks the incoming signal magnitude. A second input terminal 16 receives a signal that is generated by detection logic circuit 18, which in the present embodiment of the invention stops operation of logic driver circuit 14, i.e., prevents further production of high-frequency rectangular output waves in a manner that will be shortly described.

A speaker 20 comprises a load that is placed across output terminals $V_{OP}$, $V_{OM}$ in circuit 10. In operation, an audio input signal applied to terminal 12 is modulated by circuit 14. The amplified audio signal is applied to speaker 20, which produces audio in, e.g., a stereo or television speaker.

Considering now in more detail the structure of amplifier 10, power MOSFETs PM 12, NM 12, PM 14, NM 14 each form one of four legs of a bridge amplifier, the output of which is applied to terminals $V_{OP}$, $V_{OM}$ for driving speaker 20. Each power MOSFET includes what is referred to herein as a current sensor in parallel therewith. For example, MOSFET PM 22 is in series with resistor RP 22, the series combination being in parallel with power MOSFET PM 12. As can be seen, the power MOSFET and the current sensor are together disposed between the high side of the power supply $V_{dd}$ and an output of the amplifier $V_{OP}$. In a similar fashion, MOSFET NM 22 and resistor RN 22 together are in parallel with power MOSFET NM 12, the entire combination being disposed between the low side of the power supply $V_{ss}$ and output terminal $V_{OP}$.

Likewise, MOSFET PM 24 and resistor RP 24 are together in parallel with power MOSFET PM 14 with that combination being disposed between $V_{dd}$ and the other output terminal $V_{OM}$ of the amplifier. Finally, MOSFET NM 24 and resistor RN 24 are in parallel with power MOSFET NM 14 between the low side of the power supply $V_{ss}$ and terminal $V_{OM}$.

Detection logic circuit 18 includes four input terminals a, b, c, d each of which is taken from the junction of a different one of the resistors and monitoring transistors, like terminal a is connected to the junction between resistor RP 22 and MOSFET PM 22.

The outputs of logic driver circuit 14 on terminals $V_a$, $V_b$, $V_{ad}$, $V_{bd}$ are each connected to a different one of the gates of one of the power MOSFETs, like terminal $V_a$ is connected to the gate of the power MOSFET PM 12. The logic driver circuit outputs are also connected to the gate of each of the current-sensor MOSFETs, like the gate of MOSFET PM 22 is also connected to output terminal Va.

Turning to FIG. 2, detection logic circuit 18 includes four buffers 22, 24, 26, 28 each of which includes an input terminal that comprises one of input terminals a, b, c, d. The output terminals of buffers 22, 24 are each connected to a different input on an exclusive OR gate 30. Likewise, the output terminals of buffers 26, 28 are each connected to input terminals of an exclusive OR gate 32. The output terminals of each of exclusive OR gates 30, 32 are connected to the input terminal of an OR gate 34, the output of which provides a $V_{short}$ signal. This signal is connected to input terminal 16 on logic driver circuit 14 in FIG. 1.

Considering now normal operation of amplifier 10, i.e., operation during which there is no over-current condition in any of the power MOSFETs, attention is directed to FIG. 9, which is a table depicting different possible states of amplifier 10 during normal operation. The A GROUP and B GOUP column headings refer to signal levels appearing on the left and right sides, respectively, of the circuit of amplifier 10 in FIG. 1.

The second and third lines of the FIG. 9 table depict operation when current is flowing through speaker 20, either via the current path depicted by arrow A, in FIG. 1, or the current path depicted by arrow B. All the remaining lines depict signal combinations that might arise during state transitions of $V_a$, $V_b$, $V_{ad}$, $V_{bd}$.

For example, in the first and fourth lines of the table, the signals on terminals a, b are at the same level as are the terminal signals on terminal c, d. As a result, detection logic circuit 18 generates a $V_{short}$ output signal of zero and the amplified signal is not removed. During the transition states of the first and fourth lines of the table no current flows in amplifier 10 because the upper MOSFETs are both on and the lower MSOFETS are both off, or vice versa. In the remaining lines 5 to 9 of the table of FIG. 9, the letter F indicates that the terminal in question is floating. While the value of F is unknown, it is the same value at each terminal for each line of the operating conditions of the FIG. 9 table. As a result, as is the case with the first four lines, whenever terminals a, b and terminals c, d are at the same level—even if it is floating—$V_{short}$ will be low.

For example, in the fifth line, when $V_a$ is high, MOSFETs PM 12, PM 22 are both off. And when $V_{ad}$ is low, MOSFETs NM 12, NM 22 are both off. Likewise, with $V_b$ high, MOSFETs PM 24, PM 14 are off, and with $V_{bd}$ low, MOSFETs NM 24, NM 14 are off. All of the terminals in the A and B groups consequently float. The inputs to each of exclusive OR gates 30, 32 are all identical, which produces a low output from each and therefore a low $V_{short}$, the output of OR gate 34. In sum, for all of the operating conditions in the FIG. 9 table, $V_{short}$ is low, and the amplifier is not subject to excess current because current is either flowing through the speaker or there is no current flow.

Consideration will now be given to the operating efficiency of the amplifier. As mentioned above, when current is flowing normally through the load, current flows either in the paths depicted by arrow A or arrow B in FIG. 1. For example, when current flows along the arrow A path, the operating conditions of amplifier 10 are as shown on the second line of the FIG. 9 table. When current is so flowing, the total resistance presented by MOSFETs PM 12, PM 22 and resistor RP 22 is as depicted in Equation 1:

$$R_{P\_TOTAL}=R_{PM12}/(R_{PM22}+R_{RP22}) \quad \text{(Equation 1)}$$

Speaker 20 also presents resistance to the current path depicted by arrow A:

$$R_{LOAD}=\text{Resistance of LOAD (speaker)} \quad \text{(Equation 2)}$$

Finally, the combination of resistor RN 24 and MOSFETs NM 24, NM 14 can be calculated as follows:

$$R_{N\_TOTAL}=R_{NM14}/(R_{NM24}+R_{RN24}) \quad \text{(Equation 3)}$$

The theoretical efficiency of the amplifier when $R_{P\_TOTAL}$ equals $R_{N\_TOTAL}$, can be depicted as the resistance of the load over the entire resistance presented by the current path along arrow A:

$$n_{Theoretical}=R_{LOAD}/(R_{P\_TOTAL}+R_{LOAD}+R_{N\_TOTAL}) \quad \text{(Equation 4)}$$

Substituting $2R_{N\_TOTAL}$ for $R_{P\_TOTAL}+R_{N\_TOTAL}$ and dividing both the numerator denominator of equation 4 by $R_{N\_TOTAL}$ yields the following:

$$n_{Theoretical} = \frac{R_L}{R_{N\_TOTAL}} \div \frac{(R_L + 2R_{N\_TOTAL})}{R_{N\_TOTAL}} \quad \text{(Equation 5)}$$

Equation 5 can be re-written as follows:

$$n_{Theoretical}=R_L/R_{N\_TOTAL}+(R_L/R_{N\_TOTAL}+2R_{N\_TOTAL}/R_{N\_TOTAL}) \quad \text{(Equation 6)}$$

Defining a K ratio that is equal to the ratio of the load over the remaining resistance along the current path of arrow 34 as follows:

$$k=R_{LOAD}/R_{N\_TOTAL} \quad \text{(Equation 7)}$$

And substituting equation 7 into equation 6 yields the following:

$$n_{Theoretical}=k/(k+2) \quad \text{(Equation 8)}$$

FIG. 3 shows the relationship of load voltage and k ratio. It can be seen that as k diminishes, the voltage applied across the load decreases.

Figure 4:
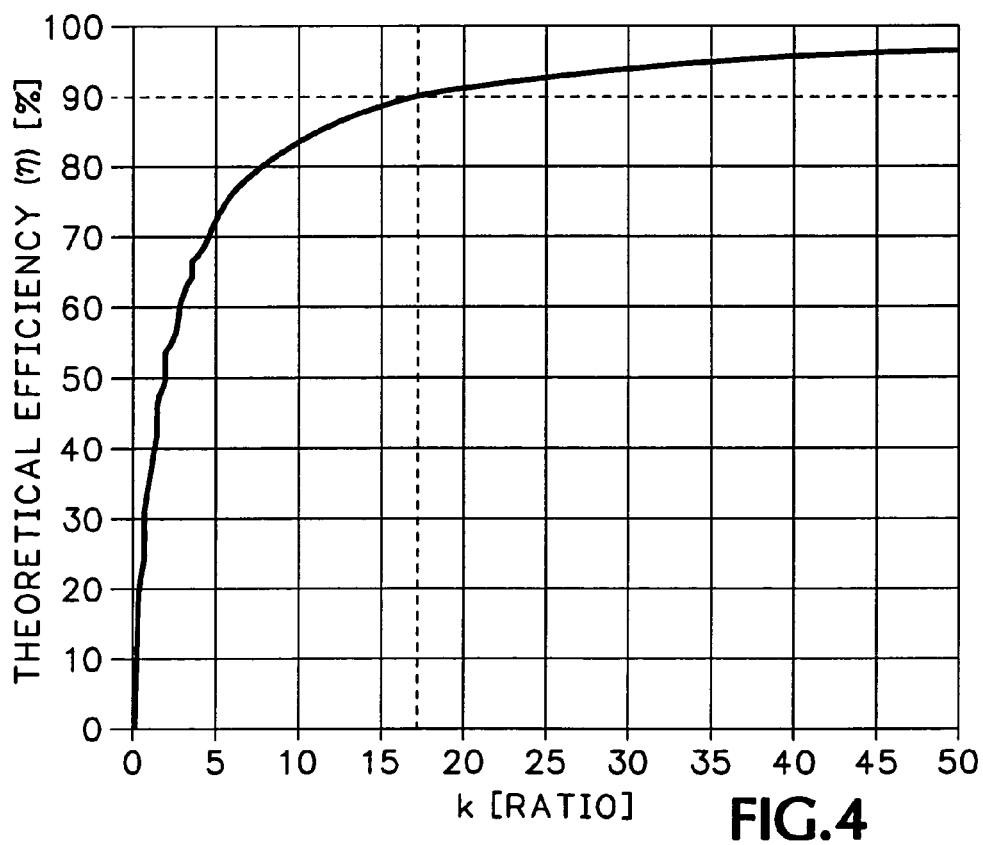

FIG. 4 is a plot of the theoretical efficiency versus k. As noted by the crossing dashed lines, when k is equal to 18, the efficiency is 90%. It is preferable to select resistance values, and therefore k, to keep efficiency at 90% or above.

Figure 5:
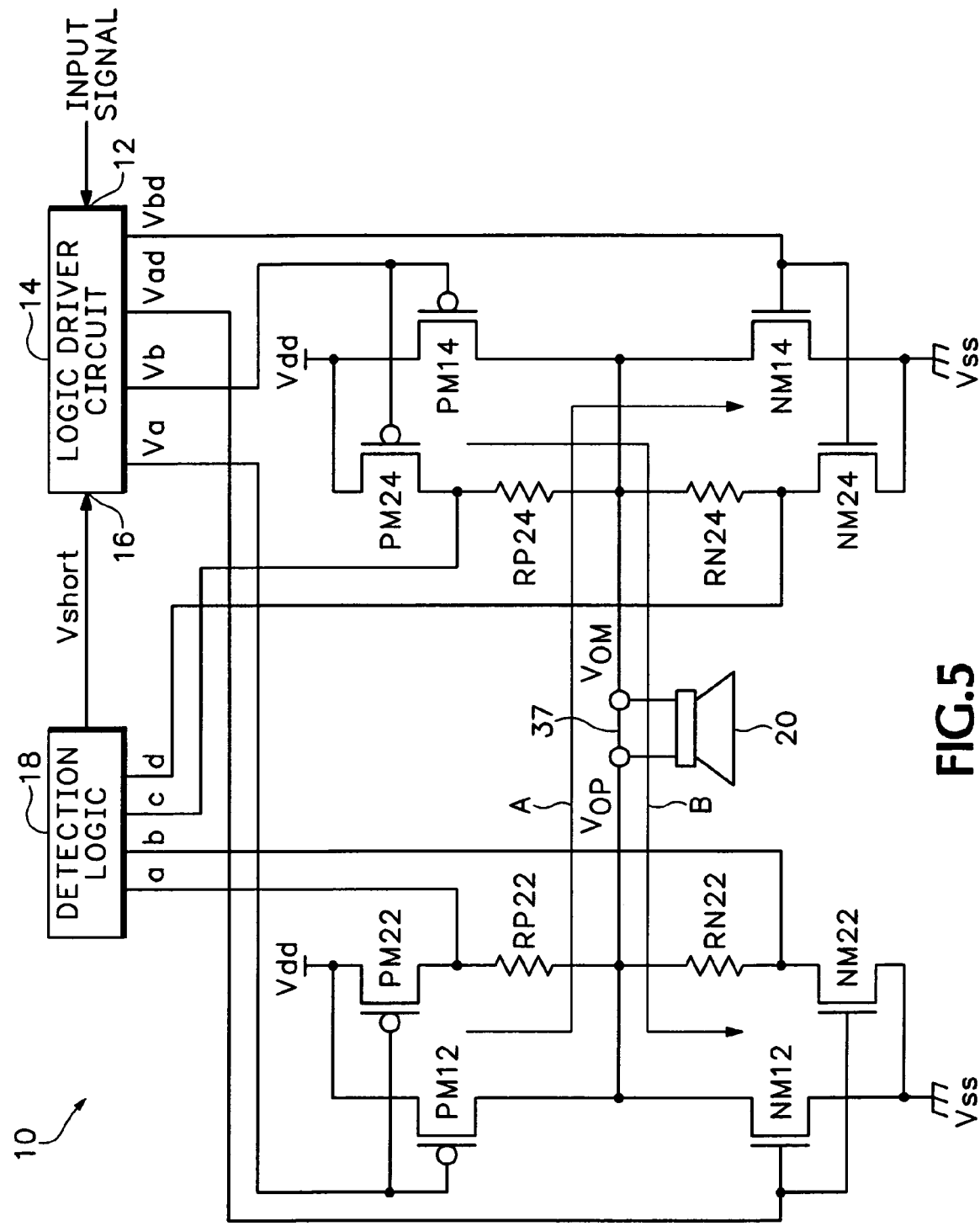
FIG. 5 is a schematic illustration of current flow during a load short in the circuit of FIG. 1.

Turning now to FIG. 5, the circuit of FIG. 1 is shown therein, but with an additional connection 37 across terminals $V_{OP}$, $V_{OM}$, which depicts a short in the load, namely speaker 20. Arrows A, B illustrate current paths that can arise in amplifier 10 in the presence of a load short like that depicted by connection 37. The various operating conditions of amplifier 10 when shorted as shown in FIG. 5 are in the table of FIG. 10. Each of the conditions on the line that includes the NO CURRENT PATH note is the same as each of its respective NO CURRENT PATH conditions in the table of FIG. 9. In other words, for the condition showing no current path in FIG. 10, no current flows in amplifier 10 for the same reasons described in connection with the normal operating conditions of FIG. 9. As a result, it is not necessary to remove the input signal to the amplifier because there are no over-current conditions.

But the second and third lines of FIG. 10 illustrate operating conditions in which current paths through the shorted load in FIG. 5 produce over-current conditions in the MOSFETs through which the current flows. For example, in the second line of FIG. 10, the MOSFETs are switched to create current path A. The entire voltage $V_{dd}$ is placed across resistors RP22, RN 24, which are of equal value. Because MOSFETs PM24, PM 14 are off, whatever value appears on shorted terminals $V_{OP}$, $V_{OM}$ also appears at signal c which is represented as X in the c column on line 2 of the FIG. 10 table. For the same reason, signal b is also designated X. While X is unknown, it will be read by the logic circuits as a either a 1 or a 0. In other words, for each line in the tables, X will be the same logic value wherever it appears. As a result, at least one of signals a, b or signals c, d will be different from one another thus triggering $V_{short}$ and stopping the input signal to the amplifier.

As can be seen on the third line of the FIG. 10 table, $V_{short}$ is also triggered high when the conditions that create current path B arise thus removing the amplifier input signal.

In sum, when there is a load short like that depicted by connection 37 in FIG. 5, there is either no current flowing in the amplifier 10, which obviates the need for over-current protection, or there is current in path A or path B with either of the latter conditions resulting in a high $V_{short}$, which removes the amplifier input signal thus protecting it from excess current.

Figure 6:
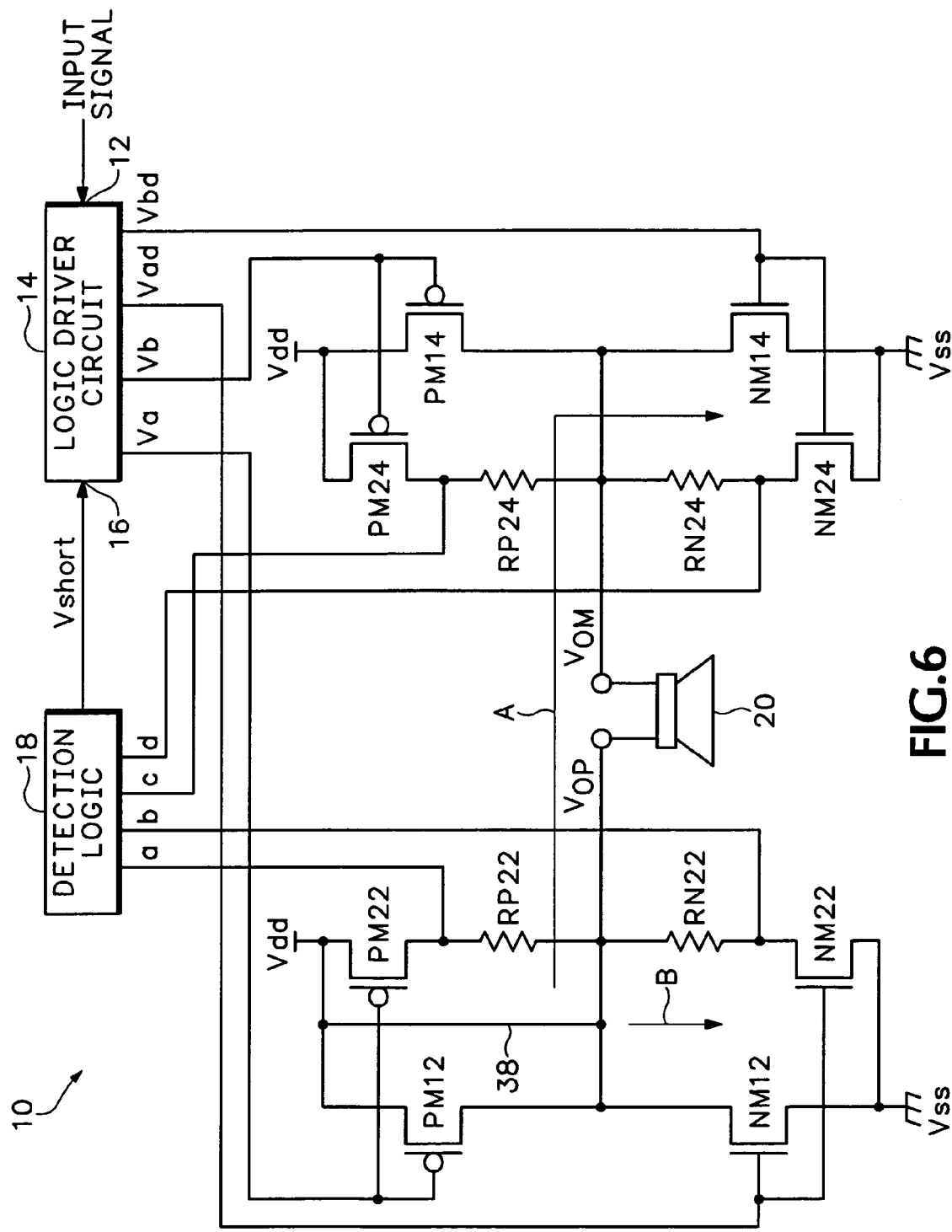
FIG. 6 is a schematic illustration of current flow during a $V_{dd}$ short in the circuit of FIG. 1.

Turning now to FIG. 6, the circuit of FIG. 1 is depicted therein, but with an additional connection 38 to indicate a short from the $V_{dd}$ side of the power supply to one side of the load, namely terminal $V_{OP}$. Arrows A, B show current paths that can arise in amplifier 10 in the presence of a $V_{dd}$ short like that depicted by connection 38. The various operating conditions of amplifier 10 when shorted as shown in FIG. 6 can be seen in the table of FIG. 11.

In a first path A, current travels via short connection 38 through speaker 20 and through the combination of resistor RN 24 and MOSFETs NM 24, NM 14 to the $V_{ss}$ side of the power supply. These conditions arise when amplifier 10 is in the operating state identified by the note Current Path A in the FIG. 11 table. In each of these conditions, $V_{short}$ is high thus removing the input signal from the amplifier. For example, in the second line of the FIG. 11 table, when $V_{ad}$ is low, MOSFETs NM 12, NM 22 are off. And with $V_{bd}$ high, current path A is the only place in the circuit where current can flow. With signals a, b at the same level, namely 1, and signals c, d at the same level, namely 0, the output of $V_{short}$ is also zero and amplifier 10 continues operation. In this mode it is not necessary to shut amplifier 10 down because speaker 20 presents a sufficient load for the current.

With current path B, however, as indicated on, e.g., the third line of the table of FIG. 11, signals a, b are different. As can be seen in the circuit of FIG. 2, this provides an output of 1 from exclusive OR gate 30, and therefore from OR gate 34, thus producing $V_{short}$ at a high level. As a result, the input signal is removed from amplifier 10 to prevent the amplifier from experiencing an over-current condition. It can be seen that such a condition results from the fact that current flowing along short connection 38 and through the combination of MOSFETs NM 12, NM 22 and resistor RN 22 is presented with very little load, thus creating the potential for an over-current condition in the MOSFETs. According to the resistance ratio of MOSFET NM 22 and resistor RN 22, signal b is logic "0" and signal a is logic "1". As a result, $V_{short}$ goes high and removes the input signal from amplifier 10.

Finally, there are conditions shown in FIG. 11 when there is no current path, even in the presence of short connection 38. As a result, it is not necessary for $V_{short}$ to be high and remove the amplifier input signal. For example, in the first line of FIG. 11, with all the outputs of logic driver circuit 14 at zero, the MOSFETs in the upper two branches of amplifier 10 are both conducting and in the lower two branches are not conducting. This presents no current path between $V_{dd}$ and $V_{ss}$, and consequently no current flows. As a result, signals a, b, c, d are all at a high level and therefore $V_{short}$ remains low.

In sum, when there is a $V_{dd}$ short, under all operating conditions the components of amplifier 10 are protected from an over-current condition either by removing the amplifier input signal, as is the case when current flows in short connection 38 and current path B, by allowing current to flow through the load, as is the case when current flows through short connection 38 and current path A, or when current does not flow in the circuit at all, as is the case when the conditions in the NO CURRENT PATH lines of FIG. 11 arise.

Figure 7:
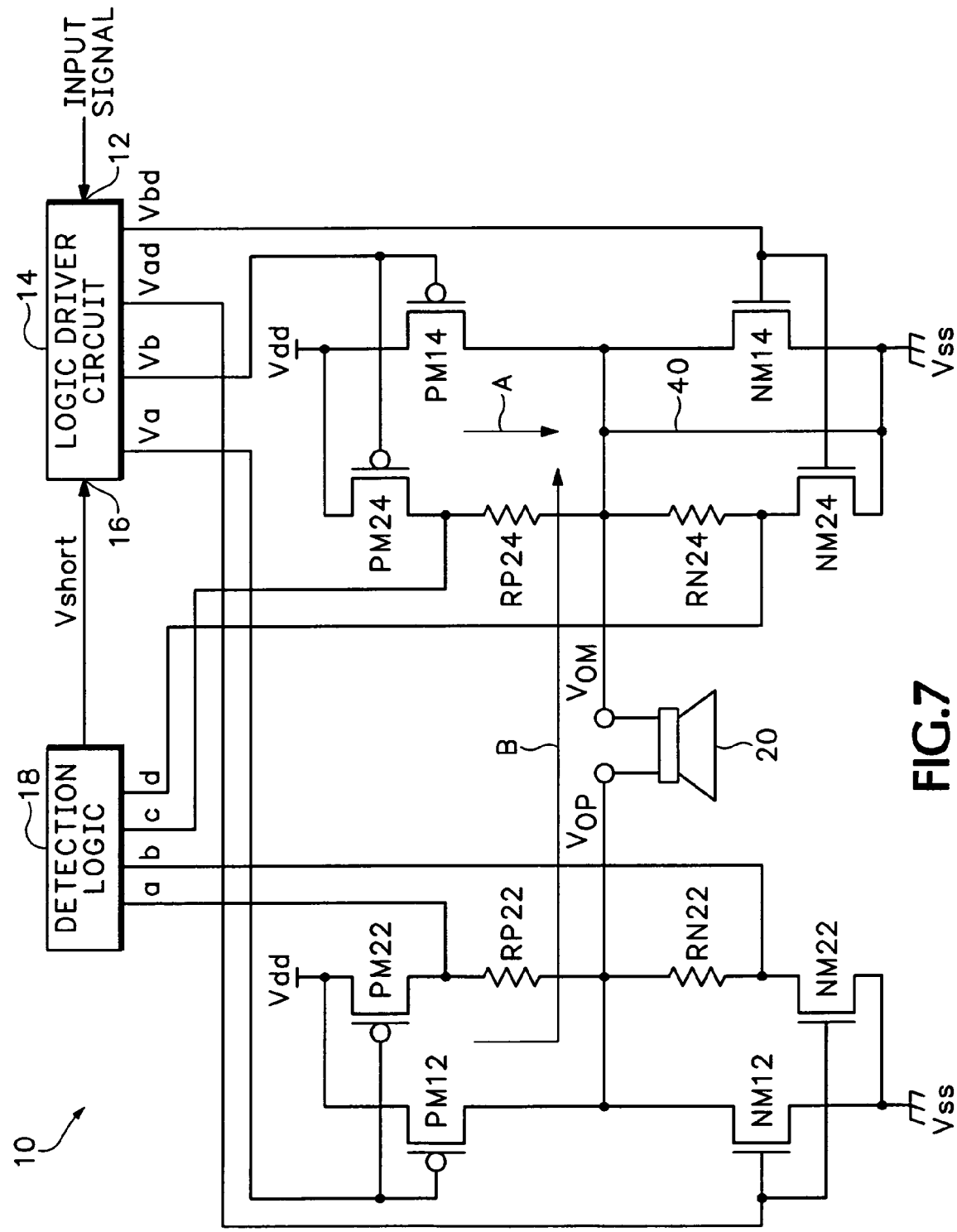
FIG. 7 is a schematic illustration of current flow during a $V_{ss}$ short in the circuit of FIG. 1.

Turning now to FIG. 7, consideration will be given to operation of amplifier 10 in the presence of the $V_{ss}$ short, like short connection 40, which connects $V_{ss}$ to one side of speaker 20, namely terminal $V_{OM}$. As was the case with the $V_{dd}$ short, there are three possibilities for current flow in the circuit, namely through current path B and short 40; through current path A and short 40; or no current flowing at all. The various states of amplifier 10 under which one of these three conditions may arise are depicted in FIG. 12. For example, in line 1 of the table of FIG. 12, with all of the outputs of logic driver circuit 14 at zero, the MOSFETs in the upper half of amplifier 10 are all on, and the MOSFETs in the lower half are all off. As a result, signals a, b, c, are all at a high level and signal d, as a result of short connection 40, is at a low level. As we have seen, whenever either signals a or b are at different levels, or signals c or d are at different levels, $V_{short}$ goes high. Because the current flowing in path A through short connection 40 is met with very little resistance, it is necessary to stop operation of the amplifier to protect the components.

Considering current path B in line two of FIG. 12, signals a, b are both high while signals c, d are both low thus keeping $V_{short}$ at a low level and permitting operation of the amplifier. This is because, as in the case with the FIG. 6 depiction of the $V_{dd}$ short, current flowing in path b passes through speaker 20 and thus is met with a substantial load that is capable of bearing the current. Under these conditions, the other components of amplifier 10 are not damaged. It is therefore not necessary to remove the amplifier input signal.

Finally, when there is no current path, for example under the conditions depicted on line 5 of FIG. 12, $V_{short}$ also remains low. While signals a, b are floating, i.e., are at an unknown potential but both at the same potential, and signals c, d are at the same potential, namely zero, $V_{short}$ remains low. Because there is no current flowing in amplifier 10 it is not necessary to remove the input signal by causing $V_{short}$ to go to a high level.

Figure 8:
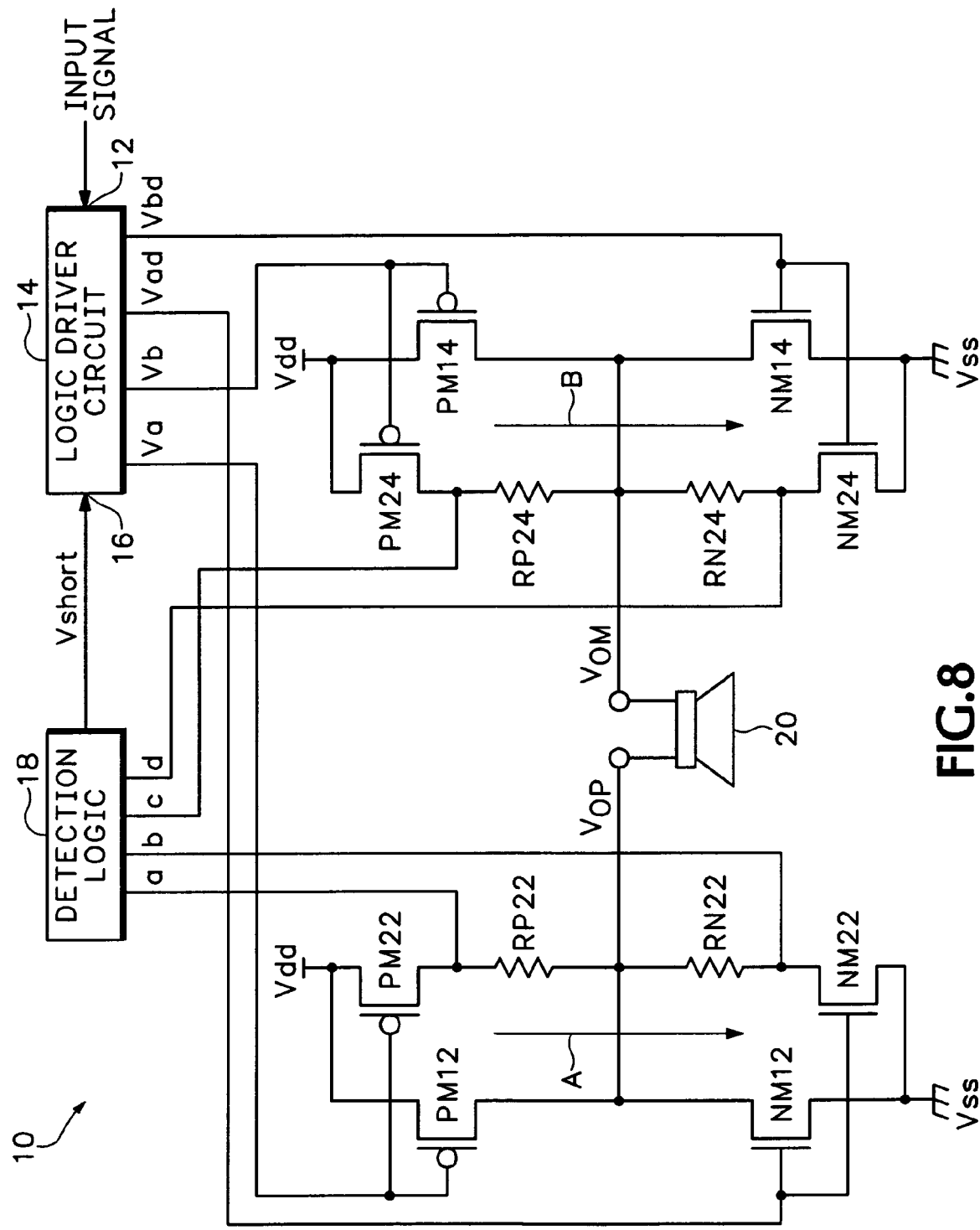
FIG. 8 is a schematic illustration of current flow during an over-current condition in the circuit of FIG. 1.

Turning now to FIG. 8, depicted therein are current paths A, B that result from errors in input signals $V_a$, $V_b$, $V_{ad}$, $V_{bd}$. The possible combinations of erroneous input signals are depicted in the table of FIG. 13. There are a total of 16 different possible input signals with 7 being erroneous, as shown in FIG. 13 and 9 being acceptable—at least to the extent that no over-current conditions are set up. The 9 acceptable combinations of input signals are depicted by the table shown in FIG. 9. The erroneous input signals in FIG. 13 all set up conditions under which current flows through one leg or the other, as shown by current path A or current path B, or through both, but not through speaker 20. As a result, it is necessary for each of the conditions shown in the table of FIG. 13 to remove the input signal responsive to a high $V_{short}$ signal. On each line of FIG. 13, either signals a, b differ from one another or signals c, d differ from one another, or both, thus creating a high $V_{short}$ signal in logic driver circuit 14 in FIG. 2.

Figure 14:
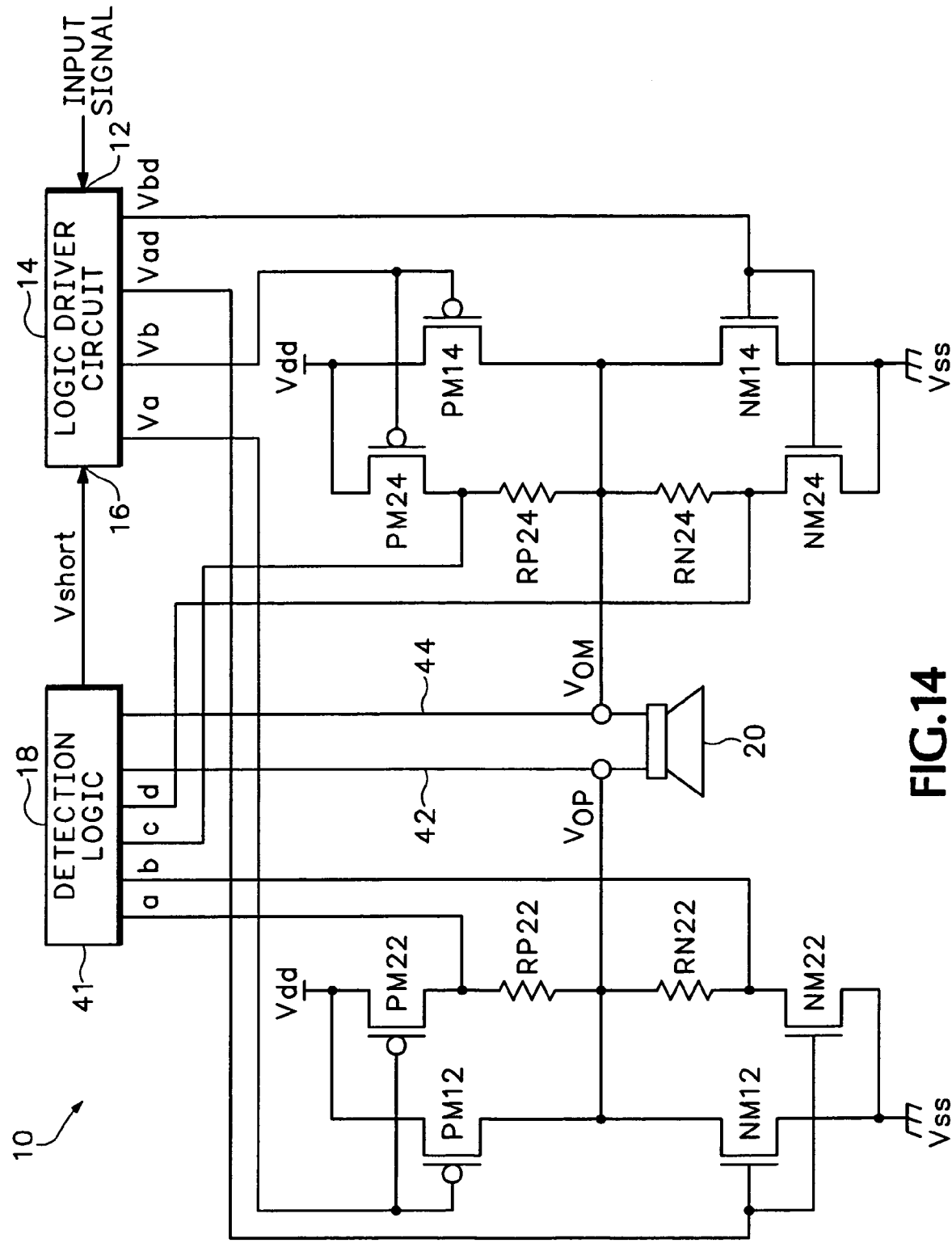
FIG. 14 is a schematic diagram of a second embodiment of a circuit implemented in accordance with the present invention.
Figure 15:
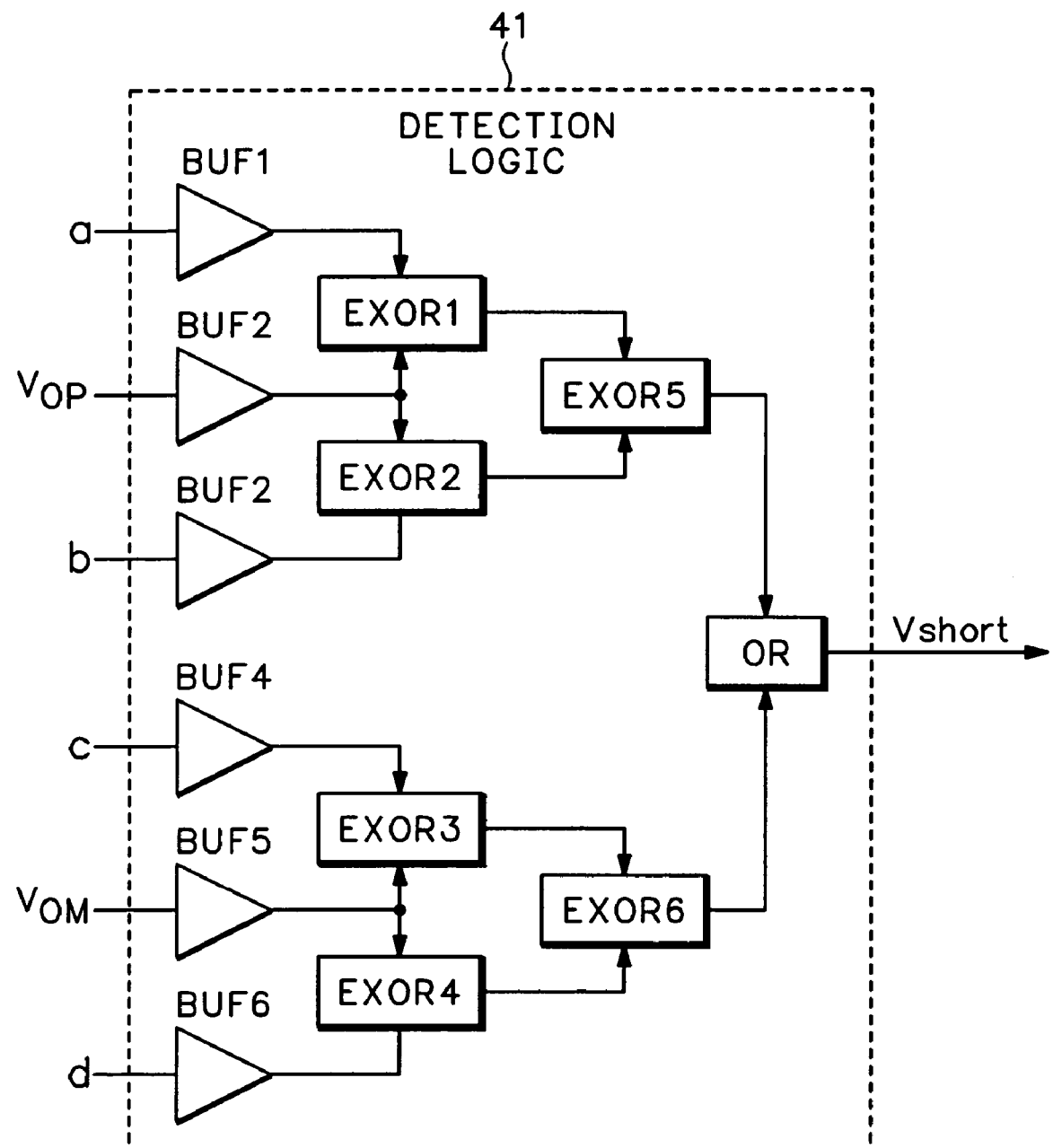
FIG. 15 is a more detailed schematic depiction of a portion of the circuit in FIG. 14.

Finally, attention is directed to FIGS. 14 and 15 for consideration of a second embodiment of the invention. Structure that corresponds to that previously identified in the embodiment of FIG. 1 retains the same numeral in FIG. 14. In addition to signals a, b, c, d, detection logic circuit 41 includes two additional input signals on lines 42, 44 namely the signals appearing on terminals $V_{OP}$, $V_{OM}$. Circuit 41 functions much like circuit 18 but includes extra inputs, namely the signals appearing on $V_{OP}$, $V_{OM}$. There is no separate table to show the various operating combinations of the circuit of FIGS. 14 and 15, but these can be derived from looking at the values from $V_{OP}$, a, b, on the one hand and $V_{OM}$, c, d, on the other hand in each of the tables depicted in FIGS. 9–13. It can be seen that the circuit of FIG. 14 provides some redundancy in that if either signal a or b is lost, or if either signal c or d is lost, the signal on terminals $V_{OP}$, $V_{OM}$, respectively, provide a redundant signal that enables the circuit to continue to protect the components from over-current conditions.

Having described and illustrated the principles of the invention in a preferred embodiment thereof, it should be apparent that the invention can be modified in arrangement and detail without departing from such principles. I claim all modifications and varation coming within the spirit and scope of the fillowing claims.

The invention claimed is:

1. In a switching amplifier having a pulse width modulator supplying an input signal to a switching transistor output bridge, an over-current protection circuit comprising:
    a current sensor for each switching transistor in said bridge to detect an over-current condition in said bridge, each said sensor comprising a resistor in series with a monitoring transistor and being constructed and arrange to provide current to a load connected to the bridge when said bridge is operating;
    a first control circuit operatively connected to the sensors for generating at least one output signal indicating an over-current condition; and
    a second control circuit to protect said bridge from such an over-current condition responsive to said output signal.

2. The over-current protection circuit of claim 1 wherein said second control circuit is constructed and arranged to interrupt operation of the switching amplifier in response to said output signal.

3. The over-current protection circuit of claim 1 wherein said first control circuit includes a pair of exclusive OR gates.

4. The over-current protection circuit of claim 3 wherein each sensor includes a resistor and wherein one side of each resistor is operatively connected to an input of one of said exclusive OR gates.

5. The over-current protection circuit of claim 4 wherein the first control circuit further includes an OR gate and wherein an output of each exclusive OR gate is connected to an input of said OR gate.

6. The over-current protection circuit of claim 5 wherein when the output of said OR gate is at a high level, the second control circuit protects said switching transistors from such an over-current condition.

7. The over-current protection circuit of claim 4 wherein each sensor further includes a monitoring transistor in series with said resistor.

8. The over-current protection circuit of claim 7 wherein the said monitoring transistors comprise FETs and wherein said amplifier comprises a Class D amplifier.

9. The over-current protection circuit of claim 8 wherein said first control circuit is constructed and arranged to generate said one output signal when either of said exclusive OR gates has different logic levels applied to the inputs thereof.

10. A switching amplifier comprising:
    a plurality of circuit branches for supplying current to a load connected to said braches;
    a switching transistor in each branch;
    a monitoring branch connected in a parallel with each of said circuit branches;
    a digital logic circuit connected to said monitoring branches to receive signal levels that together indicate whether or not an over-current condition is present in any of said switching transistors, the logic circuit including a pair of exclusive OR gates; and
    a control circuit constructed and arranged to receive an output from said digital logic circuit, said control circuit protecting said switching transistors from such an over-current condition when such signal levels indicate that an over-current condition is present.

11. The amplifier of claim 10 wherein each monitoring branch includes a resistor and wherein one side of each resistor is operatively connected to an input of one of said exclusive OR gates.

12. The amplifier of claim 11 wherein the logic circuit further includes an OR gate and wherein an output of each exclusive OR gate is connected to an input of said OR gate.

13. The amplifier of claim 12 wherein when the output of said OR gate is at a high level, the control circuit protects said switching transistors from such an over-current condition.

14. The amplifier of claim 11 wherein each monitoring branch further includes a monitoring transistor in series with said resistor.

15. The amplifier of claim 14 wherein the said monitoring transistors comprise FETs and wherein said amplifier comprises a Class D amplifier.

16. The amplifier of claim 12 wherein said digital logic control circuit is constructed and arranged to indicate whether or not such an over-current condition is present when either of said exclusive OR gates has different logic levels applied to the inputs thereof.

17. A method for preventing excess current from flowing in a switching amplifier of the type having four switching transistors that drive a load, said method comprising:
    diverting a portion of the current from each of the transistors into a branch that includes a resistor;
    monitoring the diverted current;
    directing the diverted current through the load;
    generating an over-current protection signal if one of the monitored currents exceeds a predetermined level; and
    protecting the transistors from excess current responsive to the over-current protection signal.

18. The method of claim 17 wherein protecting the transistors from excess current comprises interrupting the operation of the amplifier.

19. The method of claim 17 wherein monitoring the diverted current comprises applying a signal from one side of each resistor to a logic circuit.

20. The method of claim 19 wherein the over-current protection signal is generated by the logic circuit.

21. A switching amplifier comprising:

a first output terminal at the junction of a source terminal of a first FET and a drain terminal of a second FET;

a second output terminal at the junction between the source terminal of a third FET and the drain terminal of a fourth FET, the drain terminals of said first FET and said third FET being connected and the source terminals of said second FET and said fourth FET being connected;

a monitoring FET in parallel with each of said first, second, third and fourth FETs; and first, second, third, and fourth resistors, each of which has one end connected to a corresponding one of said monitoring FETs, the other end of said first and second resistors being connected to said first output terminal and the other end of said third and fourth resistors being connected to said second output terminal.

22. The switching amplifier of claim 21 wherein said switching amplifier further includes a logic circuit having input terminals connected to the junctions between each of said resistors and its corresponding monitoring FET, said logic circuit indicating whether there is an over-current condition present in one or two of said first, second, third, or fourth FETs.

23. The switching amplifier of claim 22 wherein said switching amplifier further includes a control circuit to protect said first, second, third, and fourth FETs from an over-current condition in response to said logic circuit indicating that there is such a condition.

24. The over-current protection circuit of claim 23 wherein said control circuit is constructed and arranged to interrupt operation of the switching amplifier in response to such an indication.

25. In a switching amplifier having a pulse width modulator supplying an input signal to a switching transistor output bridge, an over-current protection circuit comprising:

a current sensor for each switching transistor in said bridge to detect an over-current condition in said bridge, each said sensor being constructed and arrange to provide current to a load connected to the bridge when said bridge is operating;

a first control circuit operatively connected to the sensors for generating at least one output signal indicating an over-current condition, the first control circuit including a pair of exclusive OR gates; and a second control circuit to protect said bridge from such an over-current condition responsive to said output signal.

26. The over-current protection circuit of claim 25 wherein said second control circuit is constructed and arranged to interrupt operation of the switching amplifier in response to said output signal.

27. The over-current protection circuit of claim 25 wherein said current sensors each comprise a resistor in series with a monitoring transistor.

28. The over-current protection circuit of claim 25 wherein each sensor includes a resistor and wherein one side of each resistor is operatively connected to an input of one of said exclusive OR gates.

29. The over-current protection circuit of claim 28 wherein the first control circuit further includes an OR gate and wherein an output of each exclusive OR gate is connected to an input of said OR gate.

30. The over-current protection circuit of claim 29 wherein when the output of said OR gate is at a high level, the second control circuit protects said switching transistors from such an over-current condition.

31. The over-current protection circuit of claim 28 wherein each sensor further includes a monitoring transistor in series with said resistor.

32. The over-current protection circuit of claim 31 wherein the said monitoring transistors comprise FETs and wherein said amplifier comprises a Class D amplifier.

33. The over-current protection circuit of claim 32 wherein said first control circuit is constructed and arranged to generate said one output signal when either of said exclusive OR gates has different logic levels applied to the inputs thereof.

* * * * *

UNITED STATES PATENT AND TRADEMARK OFFICE
CERTIFICATE OF CORRECTION

PATENT NO. : 7,157,968 B2
APPLICATION NO. : 11/030776
DATED : January 2, 2007
INVENTOR(S) : Jaeyoung Shin It is certified that error appears in the above-identified patent and that said Letters Patent is hereby corrected as shown below:

Column 7, line 27, the word "varation" should read -- variation --;
Column 7, line 28, the word "fillowing" should read -- following --.

Signed and Sealed this

Second Day of September, 2008

JON W. DUDAS
*Director of the United States Patent and Trademark Office*